United States Patent [19]

McTeague et al.

[11] 4,106,937
[45] Aug. 15, 1978

[54] CATHODE RAY STORAGE TUBE HAVING A TARGET DIELECTRIC PROVIDED WITH PARTICULATE SEGMENTS OF COLLECTOR ELECTRODE EXTENDING THERETHROUGH

[75] Inventors: Gerald E. McTeague, Portland; Kenneth R. Stinger, Hillsboro, both of Oreg.

[73] Assignees: Tektronix, Inc., Beaverton, Oreg.;

[21] Appl. No.: 714,439

[22] Filed: Aug. 13, 1976

Related U.S. Application Data

[62] Division of Ser. No. 645,961, Jan. 2, 1976, abandoned, which is a division of Ser. No. 356,029, Apr. 30, 1973, Pat. No. 3,956,662.

[51] Int. Cl.$^2$ .......................... G03F 1/00; B05D 5/12; B05D 3/06
[52] U.S. Cl. ....................................... 96/36.1; 427/53; 427/54; 427/68; 427/64; 313/397; 313/398
[58] Field of Search ........................ 96/36.1, 38.4, 34; 313/397, 398; 427/68, 106, 108, 123, 341, 53, 54, 64

[56] References Cited

U.S. PATENT DOCUMENTS

| 3,531,675 | 9/1970 | Frankland | 313/398 |
| 3,614,820 | 10/1971 | Morris | 96/36.1 |
| 3,615,462 | 10/1971 | Szegho | 96/36.1 |
| 3,632,339 | 1/1972 | Khan | 96/36.1 |
| 3,653,939 | 4/1972 | Prazak | 427/68 |
| 3,677,758 | 7/1972 | Kaplan | 96/36.1 |
| 3,708,336 | 1/1973 | Nishizawa | 96/38.4 |
| 3,710,173 | 1/1973 | Hutchins | 313/398 |

Primary Examiner—John T. Goolkasian
Attorney, Agent, or Firm—Adrian J. LaRue; Adrian J. La Rue

[57] ABSTRACT

A cathode ray storage tube provided with a storage target having a multiplicity of segments of the collector electrode extending through the dielectric layer of the storage target. These segments comprise dots or continuous or broken protrusions of conductive particles that have been photo-deposited into position onto the collector electrode and then the storage dielectric layer is applied thereover which has proper thickness so that the segments extend above the dielectric thereby providing collector areas for collecting secondary emitted electrons from the dielectric.

3 Claims, 9 Drawing Figures

Co DOT TARGET 100X SCALE

CATHODE RAY STORAGE TUBE HAVING A TARGET DIELECTRIC PROVIDED WITH PARTICULATE SEGMENTS OF COLLECTOR ELECTRODE EXTENDING THERETHROUGH

This application is a division of application Ser. No. 645,961 filed Jan. 2, 1976, now abandoned, which is a division of Ser. No. 356,029 filed Apr. 30, 1973 and now U.S. Pat. No. 3,956,662. A related application is Ser. No. 731,166 filed Oct. 22, 1976.

BACKGROUND OF THE INVENTION

The present invention relates to cathode ray tubes and particularly to cathode ray tubes providing improved storage operation, improved storage target thereof and method of making such storage targets.

U.S. Pat. No. 3,531,675 discloses a cathode ray storage tube in which the storage target is provided with protrusions that have been etched from the insulating substrate and they and the surface from which they protrude are coated with a thin layer of transparent conductive metal oxide thereby defining a collector electrode. A dielectric layer is disposed onto this collector electrode and the other portions of the protrusions extend outwardly beyond the dielectric layer. This storage target is expensive to manufacture due to the etching of the substrate to form the protrusions and the subsequent formation of the dielectric layer can vary in thickness at various locations over the target due to variance in the etching that takes place. The area of the protrusions also vary due to non-uniformities of the substrate and the fabrication thereof. The etched configuration of the substrate makes it difficult to discern non-uniformities and defects of the protrusions and dielectric layer. The operating areas of the protrusions can be impaired due to phosphor adhering too far up the protrusions thereby reducing the collection efficiency.

SUMMARY OF THE INVENTION

The present invention is directed to a cathode ray tube in which a storage target is provided. The storage target includes a dielectric support member on which a conductive layer is disposed. Dots or protrusions of metallic particles of substantially conical or continuous configuration have their bases connected to the conductive layer and their apices extending above the top surface of the storage dielectric layer thereby defining collector areas for collecting secondary emitted electrons from the dielectric.

Such a storage target provides better collection efficiency because the phosphor area surrounding or adjacent the collector dots or protrusions is controlled so that the collector dots or protrusions provide more collector area. This enables the storage target to write information thereon via the electron beam at a faster rate and luminance is greater. The life of this storage target is longer as a result of being able to operate at a lower potential since target degradation is slower at lower operating potentials. The storage target of the present invention is easier to fabricate, therefore it is more economical; it is reclaimable, because the collector dots or protrusions can be removed and the support plate with the conductive layer thereon can be reusable to fabricate a new target. The fabrication of the present storage target can more effectively be controlled which provides better yields.

In accordance with the method aspects of the present invention, a storage target is advantageously fabricated by applying a layer of photopolymerizable material containing a dispersion of conductive particles therein onto a conductive layer on a support member. The layer of photopolymerizable material is exposed to light through a mask having the desired pattern for the collector members causing the photopolymerizable material to polymerize in the areas activated by the light. The photopolymerizable material is washed leaving behind the collective members of conductive particles having a distinct pattern. A layer of photopolymerizable material containing phosphor particles is applied onto the conductive layer and collector pattern whereafter light is applied through the collector pattern causing the photopolymerizable material to polymerize in the areas activated by the light. This layer of photopolymerizable material is washed removing the nonactivated photopolymerizable material around the collector members and leaving behind the phosphor particles defining the storage dielectric layer with the apices of the collector members extending above the outer surface of the storage dielectric.

An object of the present invention is to provide a cathode ray tube having a storage target provided with a continuous conductive layer having a collector pattern of conductive particles connected thereto and a dielectric storage target disposed on the continuous conductive layer with the outer portions of the conductive collector members extending above the outer surface of the dielectric storage target layer.

Another object of this invention is the provision of a storage target for a cathode ray tube with improved means is the provision of a storage target for a cathode ray tube with improved means for collecting secondary electrons due to larger surface area of the collecting means thereby increasing collection efficiency.

A further object of this invention is to provide a storage target for a cathode ray tube that will write at a faster rate and has increased luminance.

An additional object of the present invention is the provision of a storage target for a cathode ray tube that will have longer life as a result of being able to operate at a lower potential because target degradation is slower at lower operating potentials.

A still further object of this invention is to provide a storage target for a cathode ray tube that is easier and more economical to make due to better control over its fabrication which provides increased yield, and the support plate with conductive layer thereon is reclaimable because the collector members can be readily removed.

Still an additional object of the present invention is the method for making the storage target for a cathode ray tube.

A still another object of this invention is the provision of using the collector pattern fabricated on the conductive layer of a support member as an integral photomask when fabricating the dielectric storage target.

BRIEF DESCRIPTION OF THE DRAWINGS

Other objects and advantages of the present invention will be apparent from the following detailed description of preferred embodiments thereof and from the attached drawings of which.

DETAILED DESCRIPTION OF THE INVENTION

Figure 1:
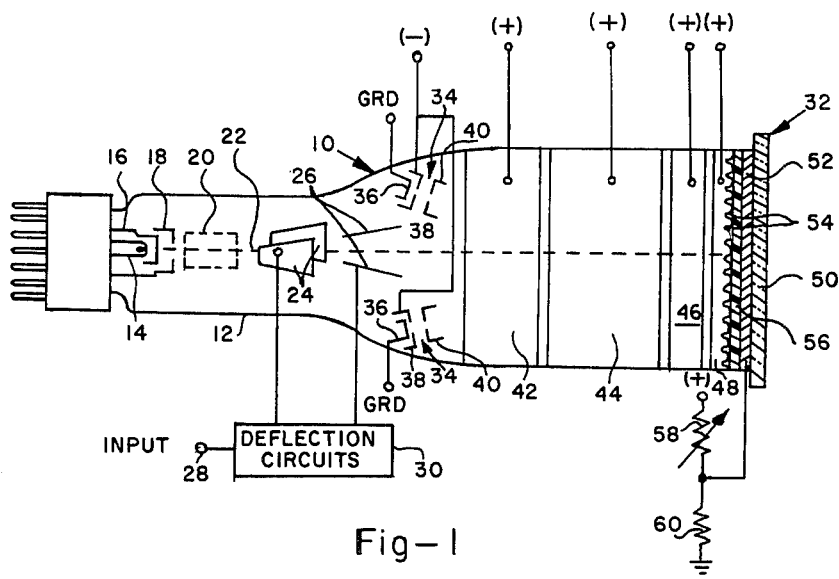
FIG. 1 is a schematic representation of a cathode ray storage tube according to the present invention.

Referring to FIG. 1, a cathode ray storage tube 10 includes an envelope 12 formed of insulating material which houses an electron gun including a filament 14, a cathode 16 for connection to a high negative voltage source, a control grid 18 and a focusing and accelerating structure 20. Electron beam 22 of high velocity electrons produced by the electron gun is deflected horizontally via horizontal deflection plates 24 and vertically by vertical deflection plates 26 in accordance with an input signal applied to input terminal 28 which operates conventional deflection circuits 30 connected to the horizontal and vertical deflection plates so that the electron beam is selectively positioned along storage target 32 at the end of envelope 12 opposite the electron gun in correspondence with the input signal.

One or more flood electron guns 34 is provided in the storage tube, each flood gun including a cathode 36, a control grid 38 and an anode 40. Flood guns 34 are supported inside envelope 12 adjacent output ends of vertical deflection plates 26. Cathodes 36 are conventionally operated at a low voltage level which is typically ground level, whereas grids 38 are connected to a low negative voltage. Low velocity electrons emitted from flood guns 34 diverge into a conically-shaped beam and they are uniformly distributed over target 32.

A plurality of electrodes are disposed on the inner surface of envelope 12 between flood guns 34 and target 32. These electrodes are preferably provided as spaced coatings of conductive material and the first coating 42 functions primarily as a focusing electrode for the flood electrons emitted from the flood guns; it is connected to a suitable source of positive electrical potential. A second electrode wall coating 44 is spaced from coating 42; it is also electrically connected to a positive potential and functions as a focusing and collimating electrode. A third coating electrode 46 is spaced from coating 44, is connected to a positive potential and functions too as a focusing and collimating electrode. As a result of the collimating action of the electrode wall coatings, the electrons from the flood guns 34 are uniformly distributed over the surface target 32.

A fourth electrode wall coating 48 is disposed between and spaced from wall coating 46 and storage target 32 and it is connected to positive voltage. Wall coating 48 also functions as a focusing and collimating electrode for the flood electrons as well as an auxiliary collector electrode to collect part of the secondary electrons emitted from storage target 32.

Electrodes 42, 44, 46 and 48 are connected to descending positive potentials with the highest positive potential being connected to electrode 42 for optimum operation.

Storage target 32 comprises insulative end plate 50 having a transparent target electrode 52 over which is disposed a series of conductive dots 54 in the form of a dot pattern and a dielectric layer 56. The insulative end plate 50 defines a support member and is made of transparent material, e.g. glass. Target electrode 52 is a thin transparent coating of preferably tin oxide which is suitably connected to the midpoint of a voltage divider which includes resistors 58 and 60 connected between a positive potential and ground. Resistor 58 is variable and is adjusted so that a proper operating voltage is applied to target electrode 52. Alternatively, target electrode 52 may be connected to amplifying means for providing an electrical readout of information stored on the storage target.

Dots 54 are conductive particles, preferably of cobalt, and have a preferably substantially conical configuration which have their bases connected to electrode 52 and apices extending outwardly from the outer surface of dielectric layer 56. Dots 54 define collector electrodes which will be more fully described hereinafter and the dots can be configurations other than conical, e.g. pyramidal, triangular, etc. Dielectric layer 56 is phosphor and preferably P-1 type phosphor.

Information is written on storage target 32 via electron beam 22, and it may be in the form of a waveform applied to vertical deflection plates 26 while the beam is scanned horizontally via horizontal deflection plates 24. In addition to electrical readout, the information written on the storage target is visibly displayed through transparent support member 50. During operation, the tube potentials are adjusted such that beam 22 has a relatively high velocity for writing and is capable of producing secondary electrons when it strikes storage dielectric 56. The area engaged by beam 22 is raised to the potential of collector electrodes 54 and target electrode 52 from ground level thus causing the dielectric target to phosphoresce thereat. These secondary electrons are then collected by collector electrodes 54, and the areas of storage dielectric engaged by beam 22 are positively charged so that flood electrons from flood guns 34 are attracted to these positively-charged areas; they emit secondary electrons at a ratio of one therefrom, the secondary electrons being collected via collector electrodes 54 adjacent the positively charged (written) areas of storage dielectric 56 thereby causing the information to be visually observed and to remain indefinitely for purposes of study or being photographed. The target can be erased in a conventional manner by pulsing the target electrode to raise the storage dielectric to the potential of the collector electrodes and then lowering it to ground level so that the flood electrons maintain it thereat until beam 22 writes information thereon again. Reference is made to the heretofore identified U.S. Pat. No. 3,531,675 for further information concerning the operation of bistable storage targets of this type.

Figure 2:
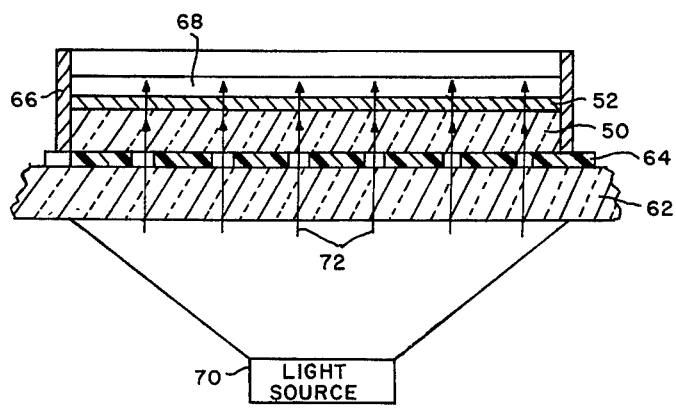
FIG. 2 is a cross-sectional view illustrating the fabrication of the conductive dot pattern on the conductive layer of a support member.

Attention is directed to FIGS. 2-6 for a description of the fabrication of the storage target 32. As shown in FIG. 2, transparent member 62 has a photomask 64 which has a hole pattern disposed thereon. Transparent support member 50 with transparent conductive layer 52 therein is positioned on photomask 64. A frame 66 is disposed around the periphery of support member 50 and a photopolymerizable slurry 68 of polyvinyl alcohol, water, ammonium dichromate, cobalt powder (2–5 microns) and isopropyl alcohol is poured onto conductive layer 52.

Any fine conductive particles or particles that are made conductive other than cobalt can be used, but the particles that are darker with reduced reflective characteristics are more desirable for trace to background contrast. In the case of cobalt, it is black and provides optimum operational characteristics. The particles may also be of the same material as the conductive layer.

Collimated light source 70 is utilized to transmit light rays 72 through transparent member 62, the holes in photomask 64, support member 50, conductive layer 50 and into slurry 68 so that light activates slurry 68 thereby polymerizing the polyvinyl alcohol in these areas.

The frame 66 is removed and the target structure is washed with water which removes the non-activated slurry and leaves behind a pattern of cobalt dots.

Figure 3:
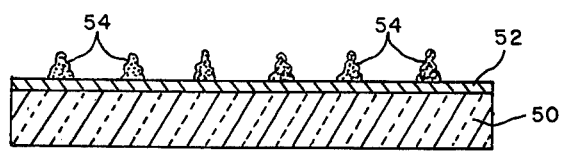
FIG. 3 is a cross-sectional view of the conductive dots on the conductive layer of the support member.
Figure 5:
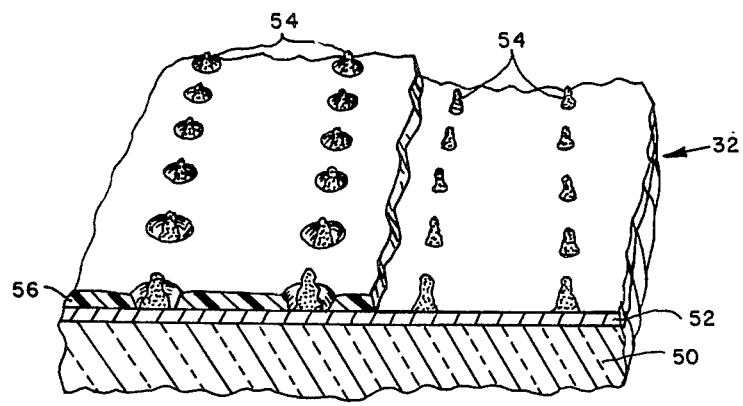
FIG. 5 is a perspective view, partly broken away and partly in cross section, of the completed storage target structure.

A shrinking agent is applied to the target structure such as acetone, aqueous ammonium sulfate, alcohols or other hydrophyllic agents and this shrinking agent shrinks the cobalt particles into a denser mass by rapid extraction of $H_2O$ thereby providing cobalt dots 54 defining a distinct dot pattern on conductive layer 52 as illustrated in FIGS. 3 and 5. The target structure is then dried.

Figure 4:
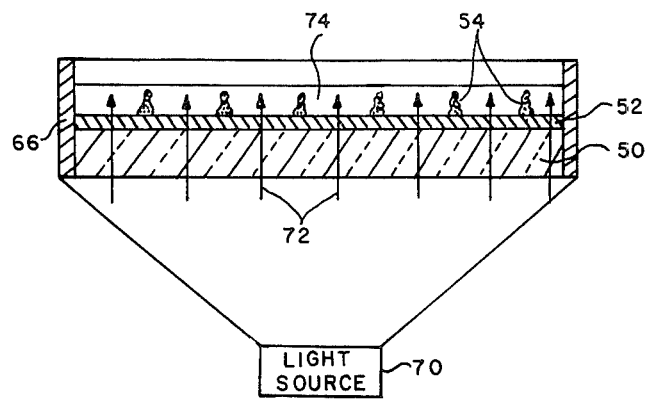
FIG. 4 is a cross-sectional view of the fabrication of the dielectric storage target.

A photopolymerizable slurry 74 of polyvinyl alcohol, water, dimethyl sulfoxide, ammonium dichromate and phosphor is introduced onto conductive layer 52 and dots 54 as shown in FIG. 4, whereafter collimated light source 70 transmits light rays 72 through support member 50, conductive layer 52 and into slurry 74 and the light rays activate slurry 74 in the areas where no dots are located thereby polymerizing the polyvinyl alcohol in these areas.

As can be discerned, no photomask in needed for this operation because the conductive dots provide an integral photomask so that in the area of each conductive dot, no polymerization of the polyvinyl alcohol will take place.

The structure is washed with water which removes the nonactivated slurry and leaves behind a layer of light activated slurry defining a dielectric layer. This target structure is then soaked by the shrinking agent used to shrink the conductive particles of the dots, and this shrinking operation shrinks the dielectric layer into a more dense configuration so that the dielectric surrounding each dot is shrunk back away therefrom thereby exposing a large area of each dot. While the photopolymerizable material for formulating the pattern of conductive collector segments and dielectric layer is in the form of a slurry, it can be in the form of photopolymerizable dry film. As can be discerned from FIGS. 5 and 6, the area of the storage dielectric layer 56 surrounding each of dots 54 slopes upwardly and away from the dots defining an annular surface 76 therearound and best defined as being in the form of a beveled hole hence the increased collector area provided by each collector dot 54 for more effectively collecting the secondary electrons. The dots 54 also extend above the outer surface of dielectric storage layer 56 about one-fourth the height of the dots.

After the storage target structure has been shrunk, it is baked in an oven at a suitable temperature to remove organic binders and leave the dielectric storage layer comprising essentially phosphor material. The storage target is now completed and is assembled in position on envelope 12 in accordance with conventional frit-sealing techniques with the support member defining the faceplate.

The dot pattern of dots 54 representing the collector electrode structure is preferably such that the center-to-center distance between adjacent dots is less than the diameter of electron beam 22 and this provides improved collector means for collecting secondary electrons, optimum resolution of the target, elimination of trace shadowing and improved visible display and readout accuracy of the stored information on the bistable storage target. The collection efficiency of secondary electrons by collector dots is increased due to larger surface area and the control of phosphor area surrounding the dots. This provides faster writing rate and improved luminance of the target. The life of the storage target is increased because the target operates at a lower operating potential since target degradation is lower at lower operating potentials.

Figures 7A, 7B:
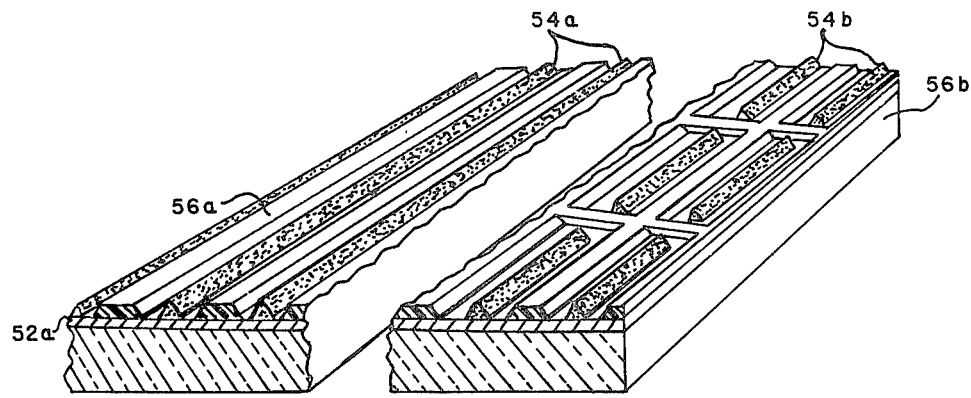
FIGS. 7a and 7b are broken perspective view of alternative embodiments of the storage target.

FIG. 7a illustrates an embodiment of the storage target wherein the collector segments 54a of particulate conductive material are continuous generally wedge-shaped protrusions that have their bases connected to conductive layer 52a and their apices extending above the outer surface of dielectric layer 56a. Thus, alternate rows of the dielectric layer and conductive collector segments define the target structure of FIG. 7a. Particulate collector segments 54b can also be discontinuous as illustrated in FIG. 7b, and the dielectric layer 56b is continuous in the areas where the collector segments are not continuous.

The areas of the dielectric layer 56a and 56b adjacent the collector segments 54a and 54b are beveled to provide greater collector area in the same manner as the collector dot pattern of FIGS. 2-6.

The target structures of FIGS. 7a and 7b are fabricated in the same manner as that of FIGS. 2-6 and the collector segments of conductive particles can take any configuration as desired to achieve the intended result.

The embodiments hereinbefore described are directed to a planar support member having the thin layer of conductive coating thereon and on which the conductive particles defining the collector dots or collector segments are connected to a conductive layer, a layer of dielectric storage material covers the conductive layer with the dielectric layer adjacent the dots or segments being provided with beveled surface means, and the apices of the dots or segments extending above the top or outer surface of the dielectric layer thereby defining a storage target of planar construction.

Figure 8:
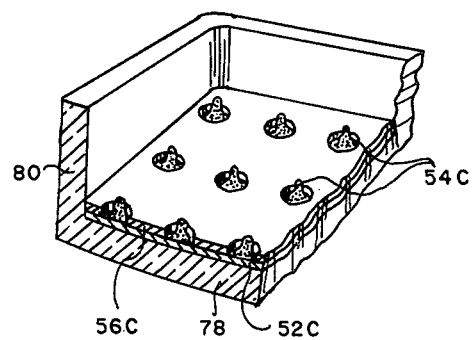
FIG. 8 is a perspective view of a corner of a front panel of a curved face plate for a large-viewing cathode ray tube.
Figure 6:
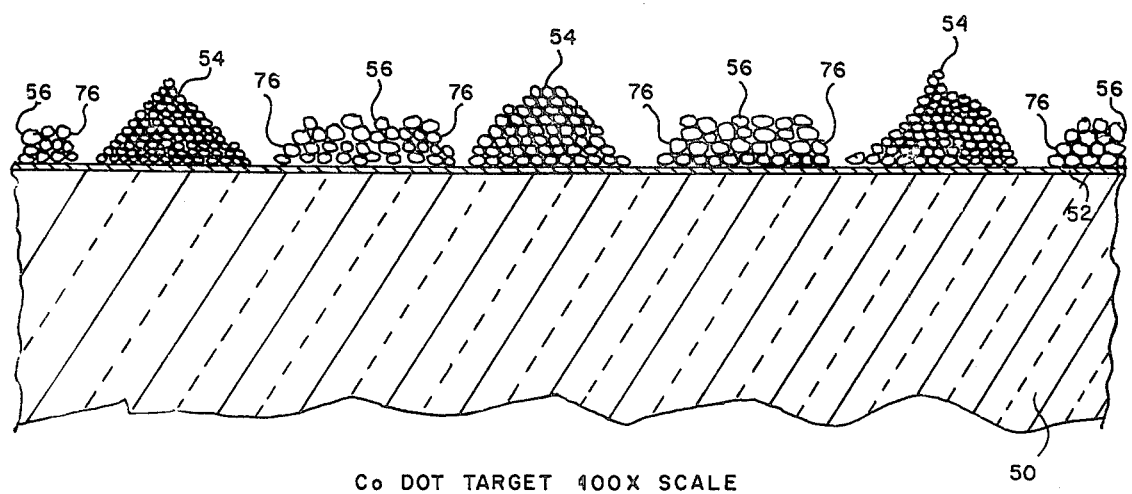
FIG. 6 is an enlarged cross section of a part of the storage target of FIG. 5.

In the embodiment of FIG. 8, a glass front panel 78 has curved inner and outer surfaces with the inner surface having conductive coating 52c, conductive collector dots 54c and dielectric layer 56c, which is fabricated in the same manner as hereinbefore described. Front panel 78 includes an integral wall 80 for securing onto the tube envelope of a larger cathode ray tube. Thus, the embodiment of FIG. 8 is directed to a curved storage target for use in conjunction with storage cathode ray tubes having a large viewing area.

The storage target of the present invention is easier to fabricate and therefore is more economical. The support member with conductive layer thereon is reclaimable, because dielectric layer and/or conductive collector pattern can be removed so that the support member with conductive layer thereon is reusable to fabricate a new storage target. Better control can be exercised over the fabrication of the present storage targets therefore resulting in better production yields.

While preferred embodiments of the present invention have been illustrated and described, it will be apparent that changes and modifications may be made to this invention without departing therefrom in its broad aspects. The appended claims therefore cover all such changes and modifications as fall therewithin.

The invention is claimed in accordance with the following:

1. A method of fabricating a storage target for use in conjunction with a cathode ray tube comprising the steps of:
applying a layer of photopolymerizable material having a dispersion of conductive particles therethroughout onto a conductive coating of a dielectric support member;
transmitting light through a pattern of openings in a photomask which activates the photopolymerizable material to polymerize same in the areas the light engages;
washing the photopolymerizable material which removes the material not polymerized and leaving in position on said conductive coating opaque segments of conductive particles;
applying a layer of photopolymerizable material having phosphor particles dispersed therein onto said conductive coating and segments of conductive particles with said segments defining an in situ photomask;
transmitting light into said photopolymerizable material through said support member with said light activating the photopolymerizable material in the areas to polymerize same except where said opaque segments are located; and
washing the photopolymerizable material which removes the material not polymerized and leaving in position layer means of phosphor.

2. A method according to claim 1 wherein said segments of conductive particles are subjected to the step of applying a shrinking agent thereto to shrink the conductive particles into a denser mass, said shrinking agent being selected from the group consisting of alcohols, ketones and hydrophyllic aqueous salt solutions.

3. A method according to claim 1 wherein said layer means of phosphor is subjected to the step of applying a shrinking agent thereto to shrink the layer means away from said segments thereby exposing more area of said segments said shrinking agent being selected from the group consisting of alcohols, ketones and hydrophyllic aqueous salt solutions.

* * * * *